United States Patent
Yeh

(10) Patent No.: US 8,250,286 B2
(45) Date of Patent: Aug. 21, 2012

(54) BLOCK MANAGEMENT METHOD, AND STORAGE SYSTEM AND CONTROLLER USING THE SAME

(75) Inventor: Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 967 days.

(21) Appl. No.: 12/259,829

(22) Filed: Oct. 28, 2008

(65) Prior Publication Data

US 2010/0011153 A1  Jan. 14, 2010

(30) Foreign Application Priority Data

Jul. 10, 2008 (TW) ................. 97126175 A

(51) Int. Cl.
*G06F 12/08* (2006.01)

(52) U.S. Cl. ....................... 711/103; 711/209

(58) Field of Classification Search .............. None
See application file for complete search history.

(56) References Cited

U.S. PATENT DOCUMENTS

| | | | | |
|---|---|---|---|---|
| 7,518,911 B2* | 4/2009 | Kamei | ............ | 365/185.03 |
| 7,676,626 B2* | 3/2010 | Lee et al. | ............ | 711/103 |
| 7,761,652 B2* | 7/2010 | Kim et al. | ............ | 711/103 |
| 7,941,588 B2* | 5/2011 | Shiga | ............ | 711/103 |
| 2008/0002467 A1* | 1/2008 | Tsuji | ............ | 365/185.11 |

* cited by examiner

*Primary Examiner* — Gary Portka
(74) *Attorney, Agent, or Firm* — J.C. Patents

(57) ABSTRACT

A block management method for managing a multi level cell (MLC) NAND flash memory is provided, wherein the MLC NAND flash memory has a plurality of physical blocks grouped into at least a data area and a spare area, each of the physical blocks has a plurality of pages divided into a plurality of upper pages, and a plurality of lower pages with a writing speed thereof being greater than that of the upper pages. The block management method includes configuring a plurality of logical blocks for being accessed by a host, recording the logical block belonging to a frequently accessed block and executing a special mode to use the lower pages of at least two physical blocks of the MLC NAND flash memory for storing data of one logical block belonging to the frequently accessed block. Accordingly, it is possible to increase the access speed of a storage system.

25 Claims, 11 Drawing Sheets

| Lower pages | upper pages |
|---|---|
| 0 | 4 |
| 1 | 5 |
| 2 | 8 |
| 3 | 9 |
| 6 | 12 |
| 7 | 13 |
| 10 | 16 |
| 11 | 17 |
| ⋮ | ⋮ |
| 110 | 116 |
| 111 | 117 |
| 114 | 120 |
| 115 | 121 |
| 118 | 124 |
| 119 | 125 |
| 122 | 126 |
| 123 | 127 |

|  502 | 504 | 506 |
|---|---|---|
| 0 | 0 | 125 |
| 1 | 1 | 0 |
| ····· | ····· | ····· |

↑ First mapping record
↑ Second mapping record

FIG. 5A

BLOCK MANAGEMENT METHOD, AND STORAGE SYSTEM AND CONTROLLER USING THE SAME

CROSS-REFERENCE TO RELATED APPLICATION

This application claims the priority benefit of Taiwan application serial no. 97126175, filed on Jul. 10, 2008. The entirety of the above-mentioned patent application is hereby incorporated by reference herein and made a part of this specification.

BACKGROUND

1. Technology Field

The present invention relates to a block management method for a flash memory. More particularly, the present invention relates to a block management method for a multi level cell (MLC) NAND flash memory, a storage system and a controller using the same.

2. Description of Related Art

With a quick developing of digital camera, cell phone camera and MP3, demand of storage media by customers is increased greatly. Since a flash memory has the advantages of non-volatile, energy saving, small size and none mechanical structure etc., it is suitable for portable applications, and especially for portable battery-powered products. A memory card is a storage device applying an NAND flash memory as the storage media. Since the memory card has a small size and a large volume, and is easy to be carried, it has been widely used for storing important personal data. Therefore, the flash drive industry becomes a hot industry within the electronics industry recently.

Generally, the flash memory of a flash memory storage system is divided into a plurality of physical blocks, and the physical blocks are grouped into a data area and a spare area. The physical blocks grouped in the data area are used for storing valid data written based on writing commands, and the physical blocks of the spare area are used for substituting the physical blocks in the data area while executing the writing command. To be specific, when the flash memory storage system receives the writing command from a host for writing the physical block of the data area, the flash memory storage system selects a physical block from the spare area, and writes old valid data stored in the physical block of the data area to be written and new data into the physical block selected from the spare area, and further associates the physical block written with the new data to the data area. Moreover, the original physical block in the data area is erased and is associated to the spare area. To smoothly access the physical blocks storing data in an alternation approach, the flash memory storage system provides logical blocks to the host. Namely, alternation of the physical blocks is reflected by recording and renewing a mapping relation between the logical blocks and the physical blocks of the data area within a logical-physical mapping table, so that the host can only performs writing to the provided logical blocks, and the flash memory storage system then can read data from or write data into the mapped physical blocks according to the logical-physical mapping table.

However, with progress of fabrication process of the flash memory, while volume design of each physical block becomes greater, time spent on moving the old valid data is comparatively increased, so that the time needed for writing data is increased. Particularly, when a flash memory storage system is used as a storage medium for installing a computer operating system, the operating system may constantly access specific data (for example, a file allocation table (FAT)), so that improvement of accessing speed for such kind of data is quite important.

SUMMARY

Accordingly, the present invention is directed to a block management method, by which data accessing speed of an MLC NAND flash memory is effectively improved.

The present invention is directed to a controller, which may apply the aforementioned block management method to manage an MLC NAND flash memory, so as to effectively improve a data accessing speed thereof.

The present invention is directed to a storage system, which may apply the aforementioned block management method to manage an MLC NAND flash memory, so as to effectively improve a data accessing speed thereof.

One principal aspect of the present invention provides a block management method, suitable for managing an MLC NAND flash memory, wherein the MLC NAND flash memory has a plurality of physical blocks grouped into at least a data area and a spare area, each of the physical blocks has a plurality of pages divided into a plurality of upper pages, and a plurality of lower pages with a writing speed thereof being greater than that of the upper pages. The block management method includes configuring a plurality of logical blocks for being accessed by a host, recording the logical block belonging to a frequently accessed block and executing a special mode to use the lower pages of at least two physical blocks of the MLC NAND flash memory for storing data of one logical block belonging to the frequently accessed block.

Another aspect of the present invention provides a flash memory storage system and a controller thereof. The flash memory storage system includes an MLC NAND flash memory, a connector and a controller. The MLC NAND flash memory of the flash memory storage system has a plurality of physical blocks grouped into at least a data area and a spare area, each of the physical blocks has a plurality of pages which can be divided into a plurality of upper pages and a plurality of lower pages with a writing speed thereof being greater than that of the upper pages. The controller includes a micro-processing unit, a flash memory interface coupled to the micro-processing unit, a buffer memory and a memory management module. The memory management module has a plurality of machine commands that can be executed by the micro-processing unit for implementing the aforementioned block management method.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 5A is a diagram illustrating a logical-physical mapping table according to an exemplary embodiment of the present invention.

DESCRIPTION OF EXEMPLARY EMBODIMENTS

The accompanying drawings are included to provide a further understanding of the invention, and are incorporated in and constitute a part of this specification. The drawings illustrate exemplary embodiments of the invention and, together with the description, serve to explain the principles of the invention.

Figure 1:
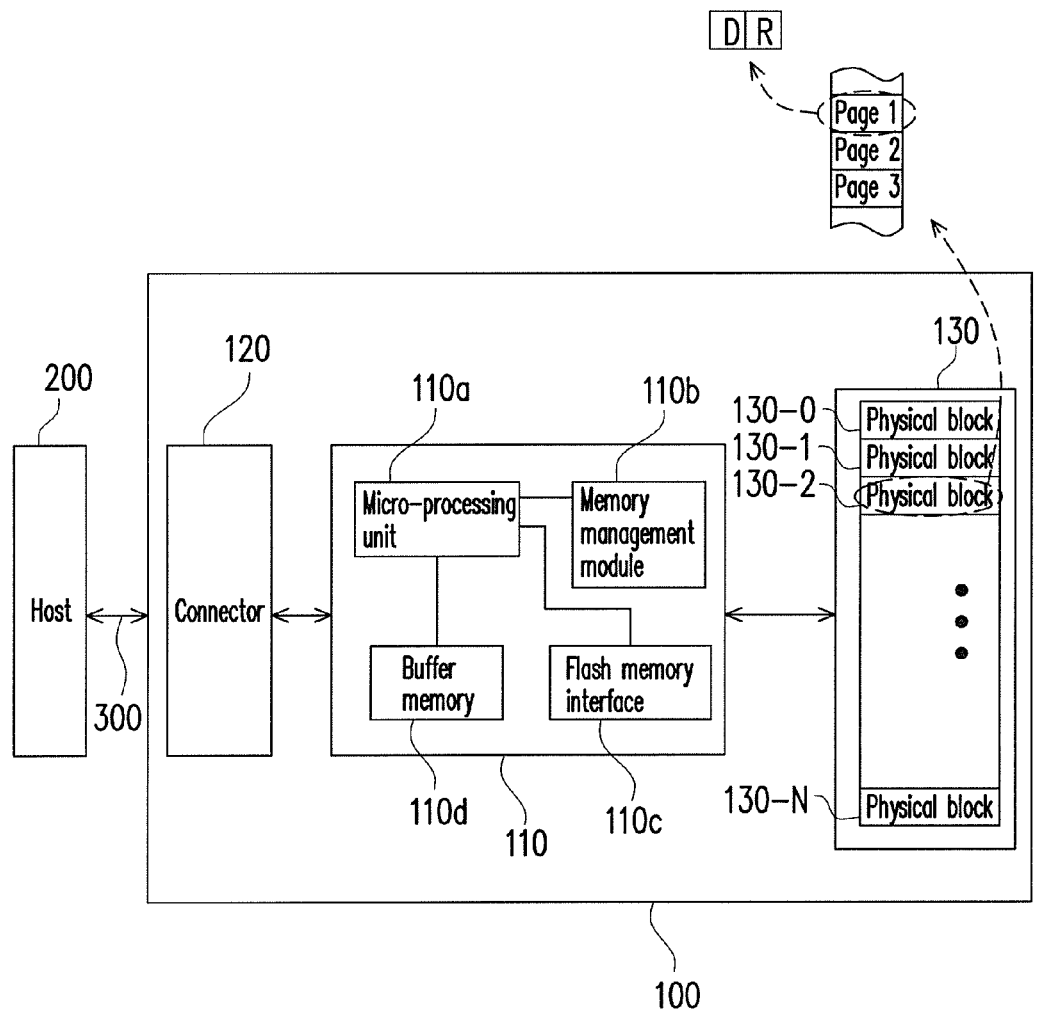
FIG. 1 is a schematic block diagram illustrating a flash memory storage system according to an exemplary embodiment of the present invention.

FIG. 1 is a schematic block diagram illustrating a flash memory storage system according to an exemplary embodiment of the present invention. Referring to FIG. 1, the flash memory storage system 100 includes a controller (which is also referred to as a controller system) 110, a connector 120 and a flash memory 130.

Generally, the flash memory storage system 100 is utilized together with a host 200, so that the host 200 can write data into the flash memory storage system 100 or read data from the flash memory storage system 100. In the present exemplary embodiment, the flash memory storage system 100 is a solid state drive (SSD). Though it should be understood that in another exemplary embodiment, the flash memory storage system 100 can also be a memory card or a flash drive.

The controller 100 can execute a plurality of commands implemented by hardware or software to perform operations of data storing, data reading and data erasing, etc. in coordination with the connector 120 and the flash memory 130. The controller 110 includes a micro-processing unit 110a, a memory management module 110b, a flash memory interface 110c and a buffer memory 110d.

The micro-processing unit 110a is utilized together with the memory management module 110b, the flash memory interface 110c and the buffer memory 110d to perform various operations to the flash memory storage system 100.

The memory management module 110b is coupled to the micro-processing unit 110a, and has a plurality of machine commands that can be executed by the micro-processing unit 110a for managing the flash memory 130, for example, executing a wear leveling procedure, managing damaged blocks, maintaining a logical-physical block mapping table, etc. Particularly, in the present exemplary embodiment, the memory management module 110b contains machine commands used for implementing a block management method of the present exemplary embodiment (shown as FIG. 6).

In the present exemplary embodiment, the memory management module 110b is implemented in the controller 110 in type of firmware, for example, the memory management module 110b is implemented by coding program-related machine commands with a program language, and storing it into a program memory (for example, a read only memory (ROM)). During operation of the flash memory storage system 100, a plurality of the machine commands of the memory management module 110b is loaded into the buffer memory 110d for being executed by the micro-processing unit 110a to implement the aforementioned functions of executing a wear leveling procedure, managing damaged blocks, maintaining a logical-physical mapping table, etc.

Figure 6:
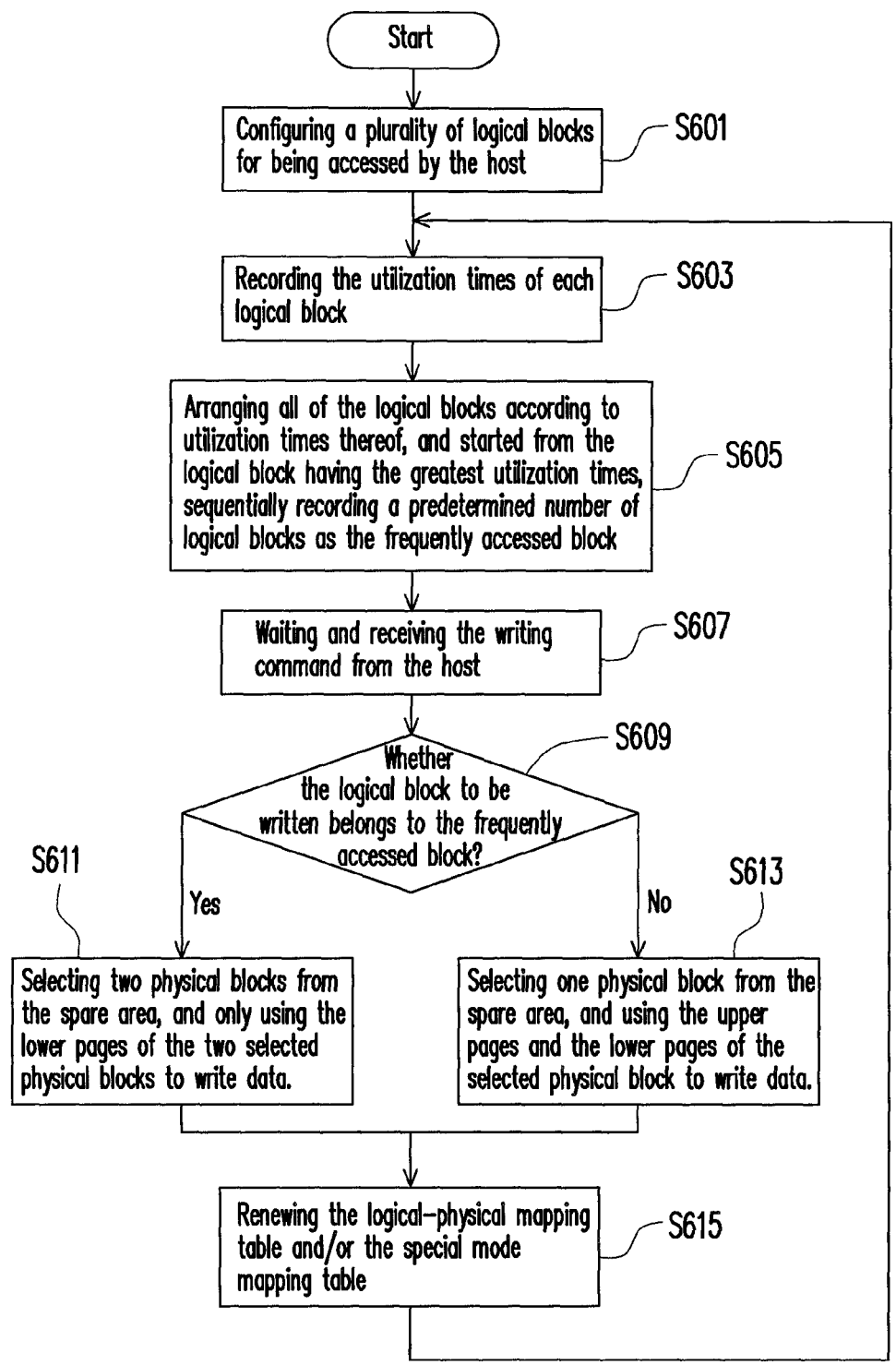
FIG. 6 is a flowchart illustrating a block management method according to an exemplary embodiment of the present invention.

Particularly, the controller 110 can execute the machine commands of the memory management module 110b to implement the block management steps of the present exemplary embodiment (shown as FIG. 6).

In another exemplary embodiment of the present invention, the machine commands of the memory management module 110b can also be stored in a specific area (for example, a system area 202) of the flash memory 130 in type of firmware. Similarly, during operation of the flash memory storage system 100, the plurality of machine commands of the memory management module 110b is loaded to the buffer memory 110d for being executed by the micro-processing unit 110a. Moreover, in another exemplary embodiment, the memory management module 110b can also be implemented in the controller 110 in type of hardware.

The flash memory interface 110c is coupled to the micro-processing unit 110a for accessing the flash memory 130. Namely, data to be written into the flash memory 130 by the host 200 is first converted into a format that can be accepted by the flash memory 130 through the flash memory interface 110c.

The buffer memory 110d is coupled to the micro-processing unit 110a for temporarily storing system data (for example, the logical-physical mapping table) or data to be read or written by the host 200. In the present exemplary embodiment, the buffer memory 110d is a static random access memory (SRAM). However, it should be understood that the present invention is not limited thereof, and a dynamic random access memory (DRAM), a magnetoresistive random access memory (MRAM), a phase change random access memory (PRAM) or other suitable memories can also be applied.

Moreover, though not illustrated, the controller 110 may further include general function modules such as an error correction module and a power management module, etc. for controlling the flash memory.

The connector 120 is used for connecting the host 200 via a bus 300. In the present exemplary embodiment, the connector 120 is a PCI express connector. However, it should be understood that the present invention is not limited thereto, and the connector 120 can also be a USB connector, an IEEE 1394 connector, a SATA connector, an MS connector, an MMC connector, an SD connector, a CF connector, an IDE connector or other suitable data transmission connectors.

The flash memory 130 is electrically connected to the controller 110 for storing data. The flash memory 130 is substantially divided into a plurality of physical blocks 130-0 to 130-N. Generally, the physical block is a minimum unit that can be erased within the flash memory. Namely, each of the physical blocks contains a minimum number of memory cells that can be erased together. Each of the physical blocks is generally divided into a plurality of pages, and the page is the minimum unit that can be programmed. It should be noted that according to different designs of the flash memory, the minimum programmable unit can also be a sector, namely, the page can be divided into a plurality of the sectors, and the sector is the minimum unit that can be programmed. In other words, the page is the minimum unit that data can be written on or read from. Each page generally includes a user data area D and a redundant area R. The user data area is used for storing a user data, and the redundant area is used for storing a system data (for example, an error correcting code (ECC)).

The data area D usually has 512 bytes and the redundant area R usually has 16 bytes in order to correspond to the size of a sector in a disk driver. Namely, one page is one sector. However, the page may also include a plurality of the sectors, for example, one page may include 4 sectors.

Generally, the physical block may include arbitrary number of pages, for example, 64 pages, 128 pages, 256 pages etc. The physical blocks 130-0 to 130-N are generally grouped into a plurality of zones, and managing of the memory based on the zones results in the fact that the zones can be operated independently, so as to increase a parallel degree of operation, and simplify a complexity of management.

Figures 2A, 2B:
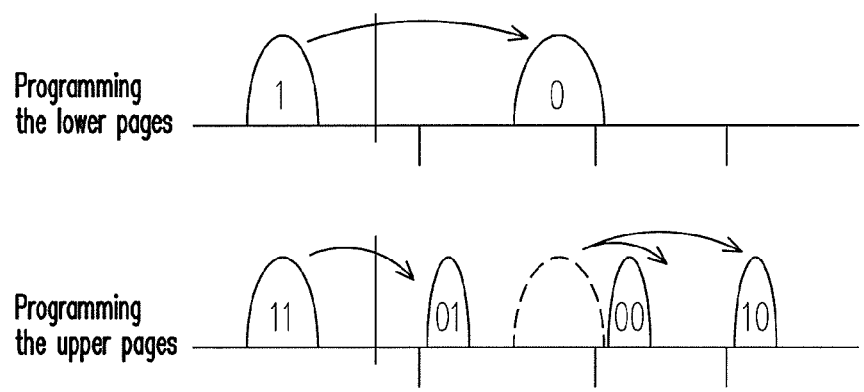
FIG. 2A is a schematic diagram illustrating a programming process of an MLC NAND flash memory.
FIG. 2B is a diagram illustrating a configuration of upper pages and lower pages of a physical block in an MLC NAND flash memory according to an exemplary embodiment of the present invention.

Moreover, in the present exemplary embodiment, the flash memory 130 is a multi level cell (MLC) NAND flash memory, and programming of the physical block in the MLC NAND flash memory includes multi stages. For example, taking a 4-level cell as an example, as shown in FIG. 2A, programming of the physical block includes two stages. In a first stage, the lower pages are programmed, and a physical characteristic thereof is similar to that of a single level cell (SLC) NAND flash memory. After the first stage is completed, the upper pages are programmed, wherein data writing speed of the lower page is higher than that of the upper page. Therefore, as shown in FIG. 2, the pages of each physical block can be divided into slow pages (i.e. the upper pages) and fast pages (i.e. the lower pages). Similarly, in case of an 8-level cell and a 16-level cell, the memory cell may include more pages, and can be programmed in more stages. Here, the page having a fastest writing speed is referred to as the lower page, and other pages having relatively slow writing speeds are all referred to as the upper pages. For example, the upper page includes a plurality of the pages having different writing speeds. Moreover, in other exemplary embodiments, the upper page can also be a page having a lowest writing speed, or pages having the lowest writing speed and having writing speeds being greater than the lowest writing speed. For example, in the 4-level cell, the lower pages are pages having the fastest writing speed and sub-fastest writing speeds, and the upper pages are pages having the lowest writing speed and sub-lowest writing speeds.

Particularly, since the plurality of pages of each physical block of the flash memory 130 can be divided into the upper pages and the lower pages as described above, the memory management module 110 may contain a page inquiry table, in which pages belonging to the upper pages and pages belonging to the lower pages within each of the physical blocks are recorded. It should be noted that a configuration of the upper pages and the lower pages shown in FIG. 2B is only an example, and the present invention is not limited thereto. Therefore, when the MLC NAND flash memory having a different configuration of the upper pages and the lower pages is utilized, the above page inquiry table can be used for recording.

Figure 3A:
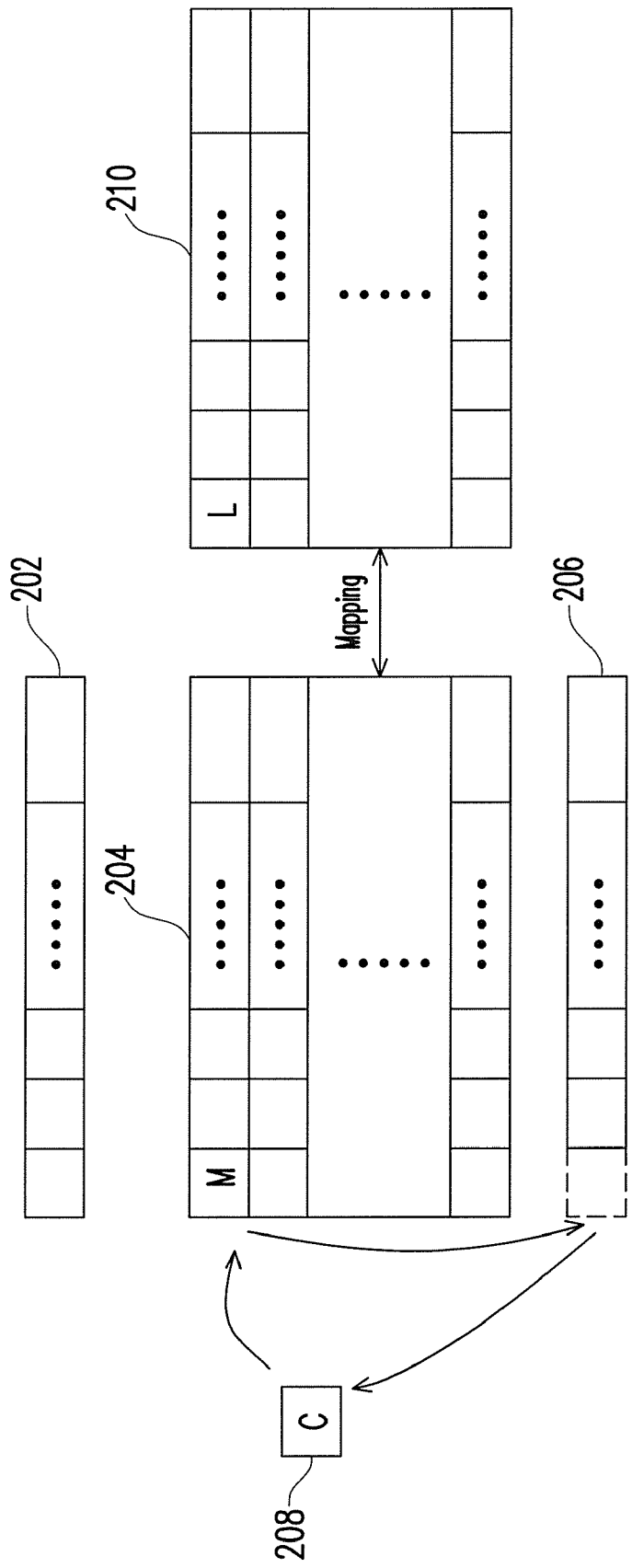
FIGS. 3A, 3B and 3C are schematic diagrams illustrating a general mode alternation of physical blocks of a flash memory according to an exemplary embodiment of the present invention.
Figure 3B:
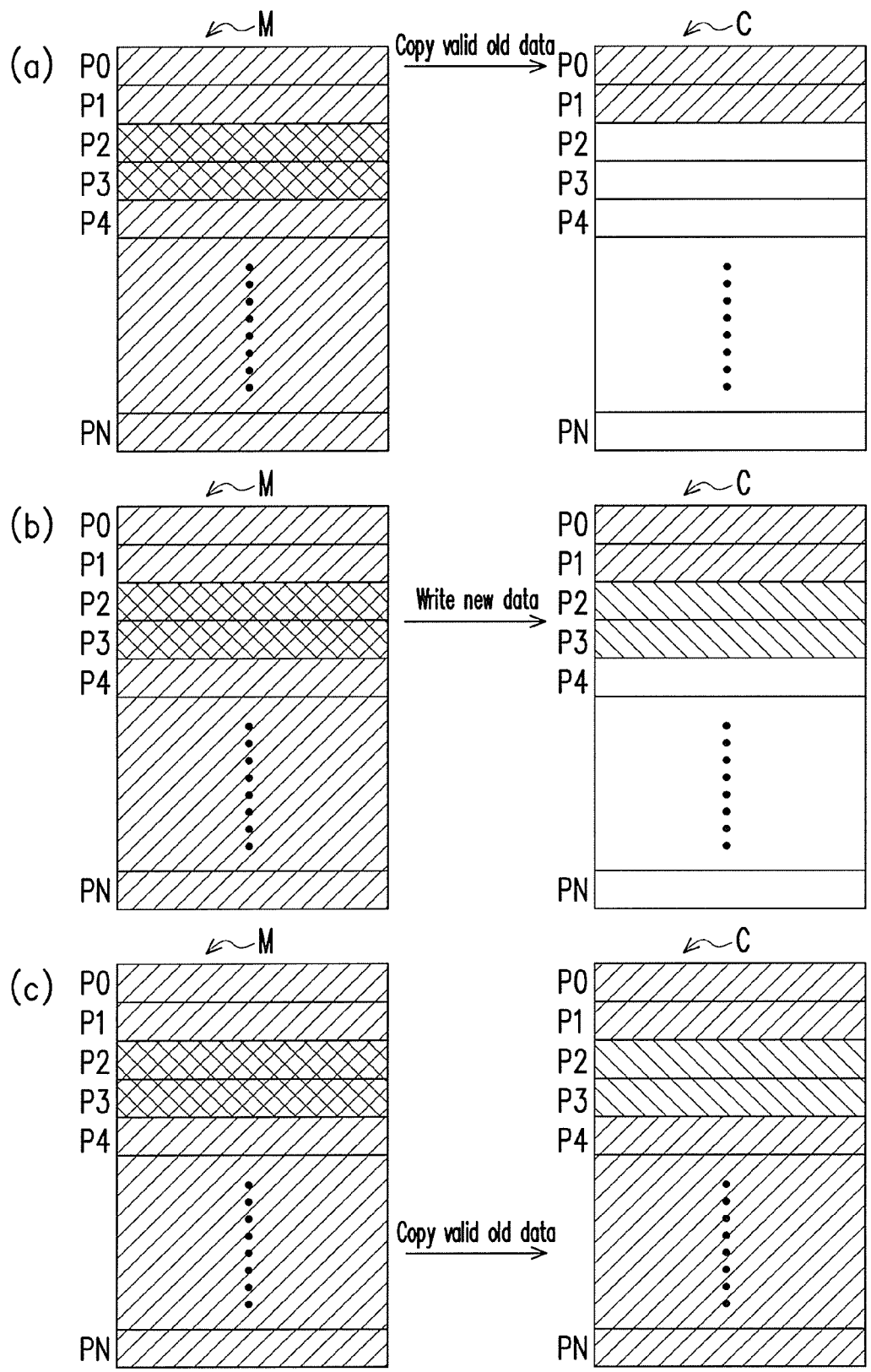
Figure 3C:
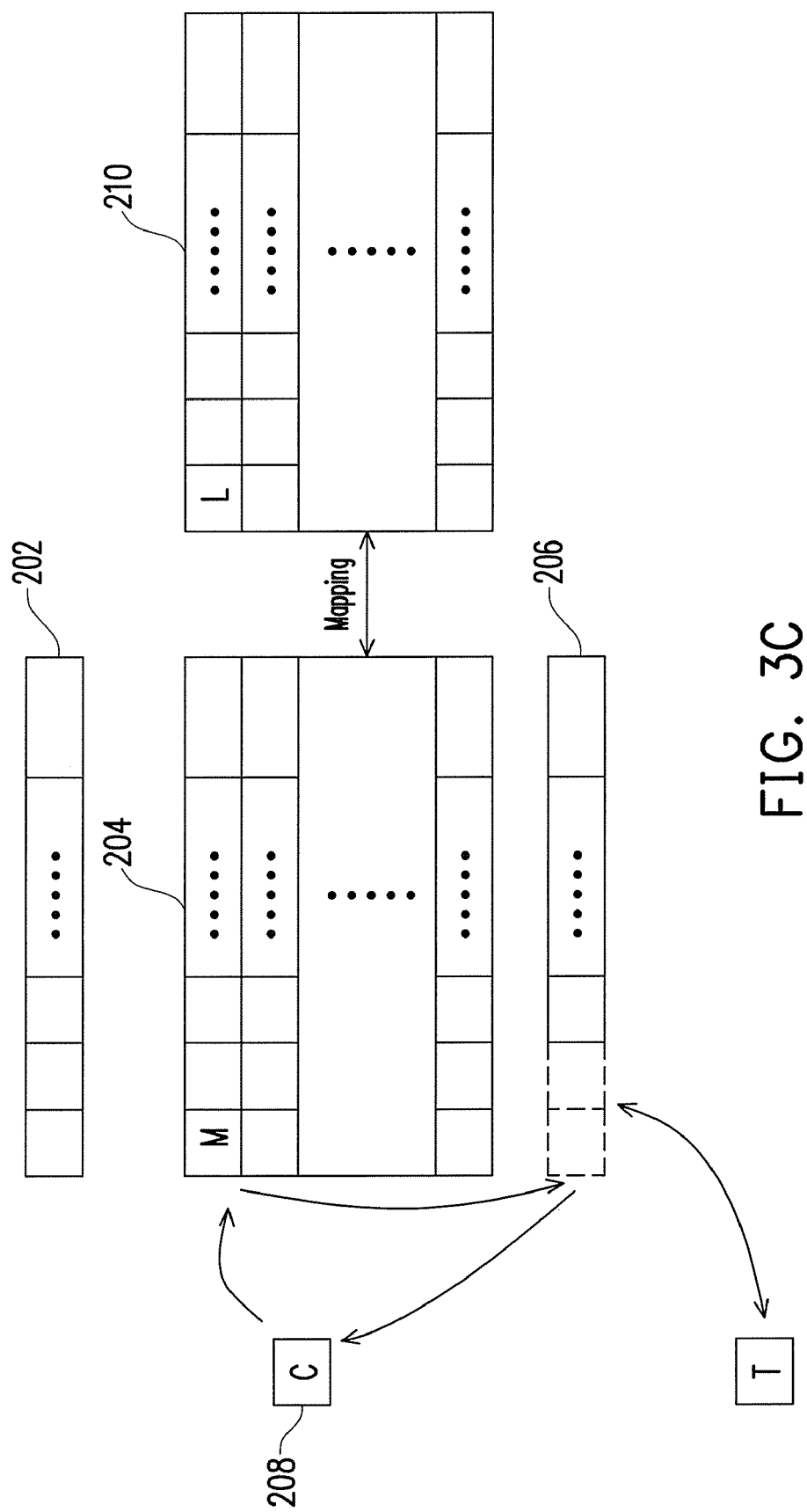

FIGS. 3A, 3B and 3C are schematic diagrams illustrating a general mode alternation of physical blocks of a flash memory according to an exemplary embodiment of the present invention.

It should be noted that that the terms used herein such as "select", "move", "exchange", "divide" and "group", etc. for operating the physical blocks 130-0 to 130-N of the flash memory 130 are only logical concepts. Namely, the physical blocks of the flash memory are only operated logically, and actual positions of the physical blocks are not changed. It should be mentioned that operations of the physical blocks are implemented by executing the machine commands of the memory management module 110b through the controller 110.

Referring to FIG. 3A, in the present exemplary embodiment, to effectively program (i.e. write and erase) the flash memory 130, the controller 110 logically groups the physical blocks 130-1 to 130-N of the flash memory 130 into a system area 202, a data area 204 and a spare area 206. Generally, the physical blocks belonging to the data area 204 in the flash memory 130 occupy 90% of all of the physical blocks. As described above, the physical blocks 130-1 to 130-N of the flash memory 130 are provided to the host for storing data in an alternation approach. Therefore, the controller 110 can provide the logical blocks 210 to the host for data accessing, and can record the physical blocks mapped to the logical blocks via a logical-physical mapping table.

The physical blocks in the system area 202 are used for recording the system data, and the system data is for example, area numbers of the flash memory 130, physical block numbers of each area, page numbers of each physical block, and the logical-physical block mapping table, etc.

The physical blocks in the data area 204 are used for storing user data, which are generally physical blocks mapped to the logical blocks 210 accessed by the host 200.

The physical blocks in the spare area 206 are used for substituting the physical blocks in the data area 204. Therefore, the physical blocks of the spare area 206 can be empty or applicable physical blocks, i.e. blocks that are not stored with data or blocks stored with data marked to be invalid.

To be specific, since each address in the flash memory can only be programmed once, if data is about to be written to the locations with data thereon, erasing of the existing data has to be performed first. However, as mentioned above, the page is the minimum writable unit, and the physical block is the minimum erasable unit. The minimum writable unit is less than the minimum erasable unit. Therefore, if the physical block is desired to be erased, valid pages within the physical block to be erased have to be copied to the other physical blocks first.

For example, when the host desires to write data to a logical block L within the logical blocks 210, the controller 110 then obtains information that the logical block L is presently mapped to the physical block M in the data area 204 via the logical-physical mapping table. Therefore, the flash memory storage system 100 may update the data stored in the physical block M. During which the controller 110 selects a physical block C from the spare are 206 to substitute the physical block M of the data area 204. However, while the new data is written into the physical block C, all of the valid data stored on the block M may not be moved to the physical block C immediately for erasing the physical block M. To be specific, the controller 110 copies the old valid data of the pages (i.e. pages P0 and P1) in the physical block M to be written to the physical block C (shown as (a) of FIG. 3B), and writes the new data (i.e. pages P2 and P3 of the physical block C) to the physical block C (shown as (b) of FIG. 3B). Now, the physical block C containing a part of the old valid data and the written new data is temporarily associated to a substitute physical block 208. This is because the valid data on the physical block M can be turned to invalid during a next operation (for example, write a command). Therefore, immediate movement of all of the valid data on the physical block M to the physical block C is unnecessary. In this case, integration of the data on the physical block M and the physical block C is the data on the mapped logical block L. The number of such mother-child blocks (i.e. the physical block M and the physical block C) can be determined by the size of the buffer memory 110d within the controller 110, and five child blocks are provided in the present exemplary embodiment. Operation for temporarily maintaining such transient relation (i.e. the mother-child blocks) is referred to as opening the mother-child blocks.

Next, when the data of the physical block M and the data of the physical block C need to be actually integrated, the controller 110 combines the physical block M and the physical block C to be one block, so as to improve a utilization efficiency of the blocks, and such a combination operation is referred to as closing the mother-child blocks. For example, as shown in (c) of FIG. 3B, when the mother-child blocks are closed, the controller 110 copies the remained valid data (i.e. pages P4-PN) in the physical block M to the physical block C, and erases the physical block M and associates it to the spare area 206. Meanwhile, the physical block C is associated to the data area 204, and the logical block L in the logical-physical block mapping table is changed to map to the physical block C, so as to complete operation of closing the mother-child blocks.

Since programming specification of the flash memory 130 requires that writing has to be performed from the first page to the last page of each physical block, and under a condition that each bit can only be programmed once (i.e. can only be changed from "1" to "0"), once a page of the physical block is written with data, and if the written data is about to be renewed, a physical block has to be selected from the spare area 206 as shown in FIG. 3A, and steps shown in FIG. 3B are repeated. Therefore, before the close operation shown as (c) of FIG. 3B is performed to the physical block (i.e. in a transient state shown as (b) of FIG. 3B), if the newly moved data (for example, P0-P1 shown in (a) of FIG. 3B) has to be renewed, the moved old data then has to be moved again, which is referred to as a random write mode.

For example, a file allocation table (FAT) is generally utilized in a storage device to manage the storage medium, wherein data accessing of the FAT is rather frequent. Therefore, when the FAT is accessed, the random write mode can be activated due to constant moving of the newly moved data. When the random write mode is entered, the controller 110 can directly write data into the physical block C in order, and valid data moving operation shown as (a) of FIG. 3B can be omitted, so that repeat execution of the steps of FIG. 3A and FIG. 3B under the random write mode can be avoided. Moreover, after the random write mode is ended, a physical block is selected from the spare area 206 to combine the valid data of the physical block M and the substitute physical block C. Here, the substitute physical block C under the random write mode is also referred to as a random sub-block.

Moreover, in another exemplary embodiment, when the host 200 constantly writes data less than one page to the logical block L, the controller 110 again selects one physical block from the spare area 206 to serve as a temporary physical block, and sequentially writes the data less than one page to the pages of the temporary physical block. Moreover, after the mother-child block relation is closed, the valid data are integrated.

For example, as shown in FIG. 3C, when the logical block L processed with the mother-child block transient relation (i.e. the physical block M and the substitute physical block C) enters the random write mode, the controller 110 again selects a physical block from the spare area 206 to serve as a temporary physical block T, and during the random write mode, data to be written into the logical block L by the host 200 is temporarily stored in the temporary physical block T. Next, when the random write mode is ended, the data in the temporary physical block T is integrated to the substitute physical block C, and the temporary physical block T is erased and moved back to the spare area 206.

In the present exemplary embodiment, besides the general mode shown as FIG. 3A and FIG. 3B is applied to store the data of the logical block L, the controller 110 can also execute the machine commands of the block management module to store the data of the logical block L in a special mode. To be specific, in the special mode, the controller 110 uses the lower pages of two substitute physical blocks to store the data of the logical block. As described above, since the writing speed of the lower page is greater than that of the upper page, only storing data into the lower pages can improve a data accessing speed thereof. However, since total amount of the lower pages in a physical block occupies a half of the pages of the physical block, in the special mode of the present exemplary embodiment, the lower pages of two physical blocks are used for storing data of one logical block. It should be noted that total page number of the lower pages can also be 1/N of the pages of the physical block, wherein N is a nature number.

Figure 4A:
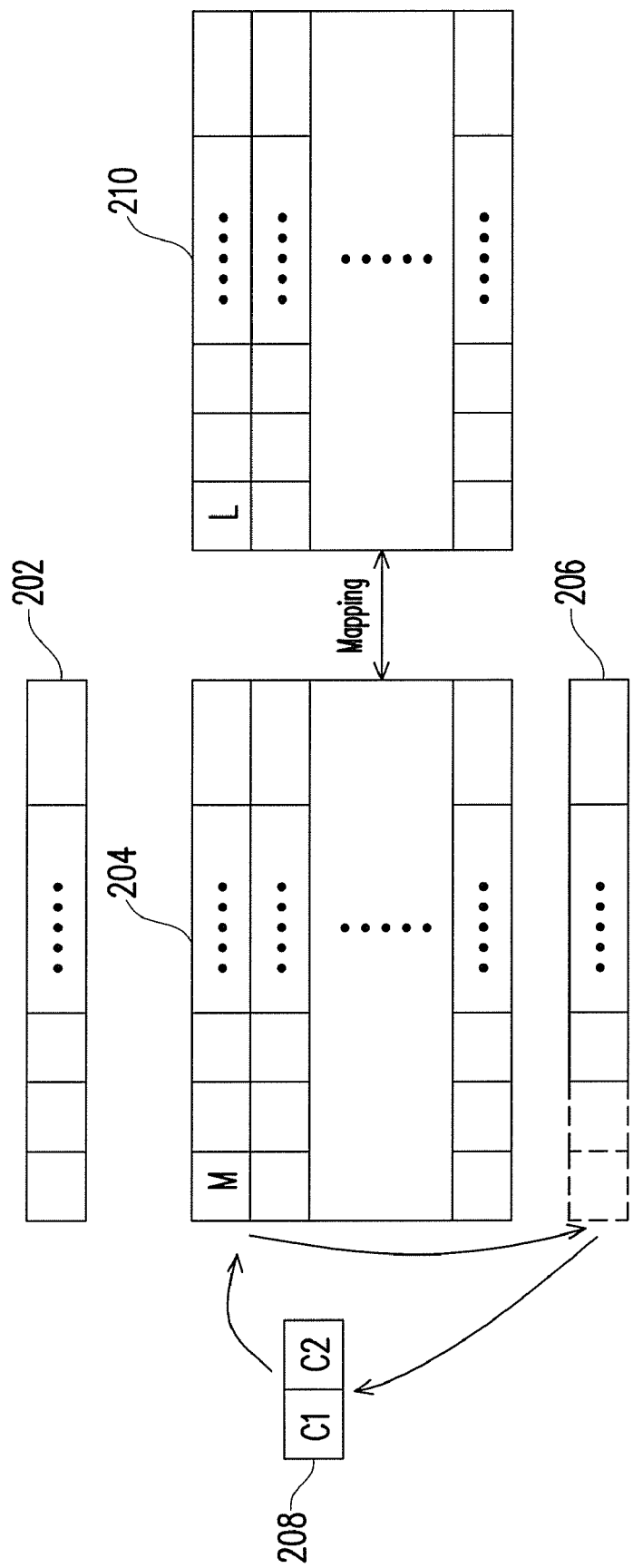
FIGS. 4A, 4B and 4C are schematic diagrams illustrating a special mode alternation of physical blocks of a flash memory according to an exemplary embodiment of the present invention.
Figure 4B:
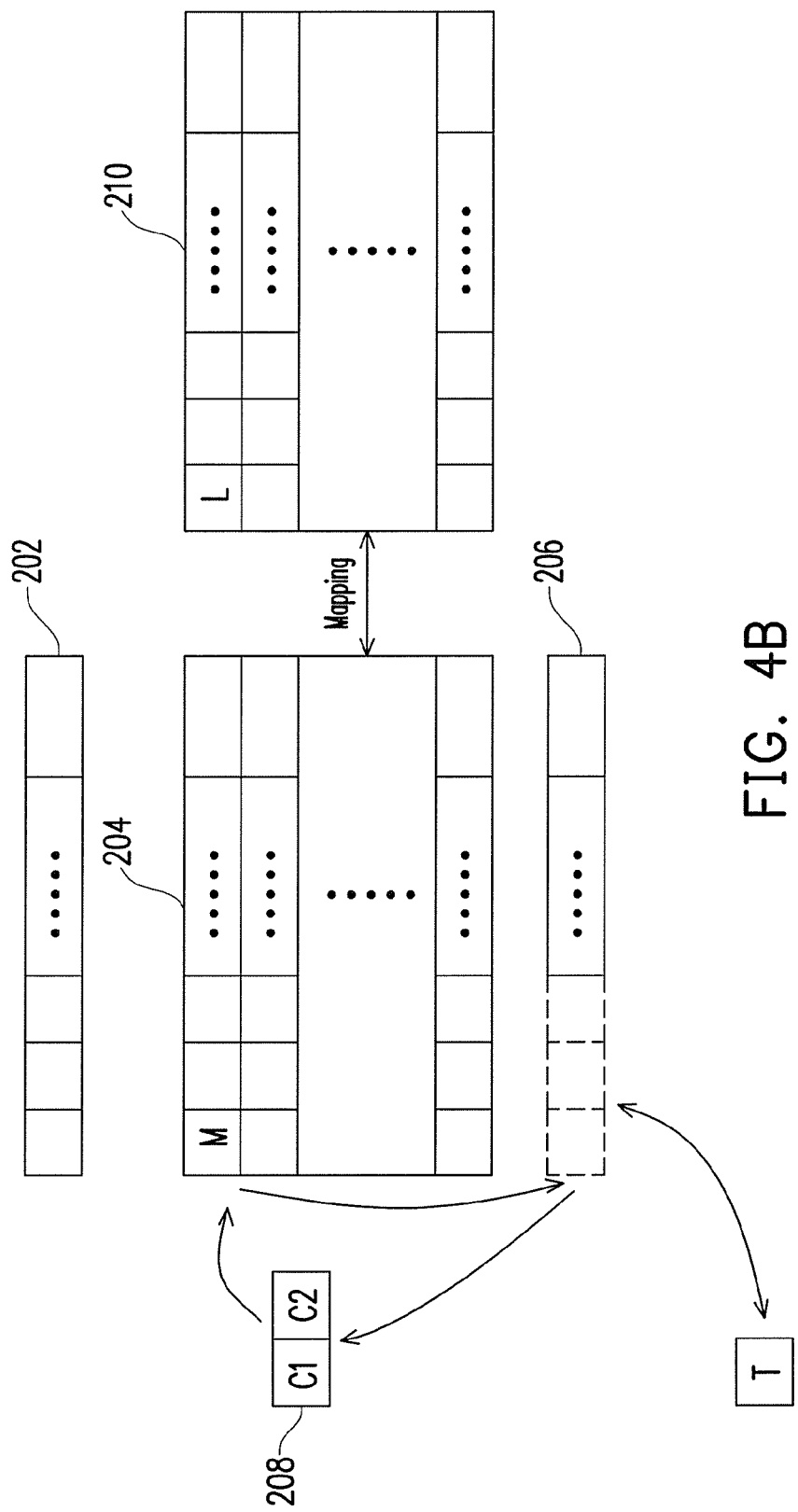
Figure 4C:
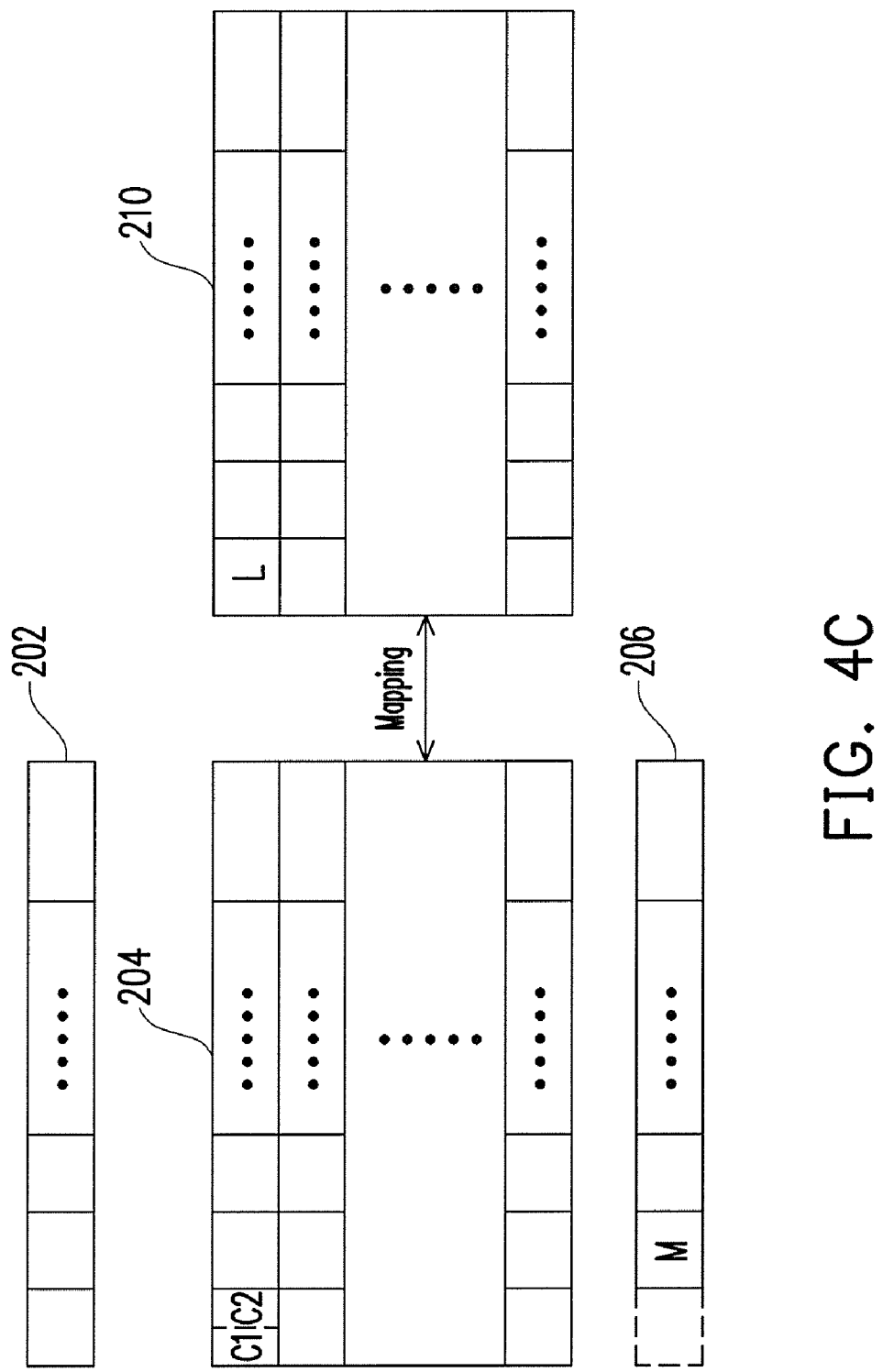

FIGS. 4A, 4B and 4C are schematic diagrams illustrating a special mode alternation of physical blocks of a flash memory according to an exemplary embodiment of the present invention.

Referring to FIG. 4A, when the host 200 desires to write data into the logical block L among the logical blocks 210, the controller 110 obtains information that the logical block L is presently mapped to the physical block M in the data area 204 via the logical-physical mapping table. Therefore, the flash memory storage system 100 may update the data stored in the physical block M. During which the controller 110 selects a physical block C1 and a physical block C2 from the spare are 206 to substitute the physical block M of the data area 204. Similarly, while the new data is written into the physical block C1 and the physical block C2, the controller 110 does not immediately move all of the valid data stored on the block M to the physical block C1 and the physical block C2 for erasing the physical block M, but temporarily maintains the mother-child block transient relation (i.e. the physical block M, the substitute physical block C1 and the substitute physical block C2).

When the logical block is in the special mode (i.e. data of the logical block is stored in lower pages of two physical blocks), and is processed with the mother-child block transient relation, if the logical block enters the random write mode, similarly, the controller 110 can select a physical block from the spare area 206 to serve as a temporary physical block for temporarily storing data to be written. Moreover, data integration is performed after the random write mode is ended.

For example, as shown in FIG. 4B, when the logical block L processed with the mother-child block transient relation (i.e. the physical block M and the substitute physical block C) enters the random write mode, the controller 110 again selects a physical block from the spare area 206 to serve as a temporary physical block T, and during the random write mode, data to be written into the logical block L by the host 200 is temporarily stored in the temporary physical block T. Next, when the random write mode is ended, the data in the temporary physical block T is integrated to the substitute physical block C1 and the substitute physical block C2, and the temporary physical block T is erased and moved back to the spare area 206.

In the present exemplary embodiment, since the logical block can be in the general mode or the special mode, the controller 110 has to obtain information that whether the logical block is in the special mode and the lower pages of which two physical blocks are utilized by the logical block in the special mode. FIG. 5A is a diagram illustrating a logical-physical mapping table according to an exemplary embodiment of the present invention. Referring to FIG. 5A, in the present exemplary embodiment, the logical-physical mapping table includes a logical block field 502, a special mode mark field 504 and a physical block filed 506. The physical block field 506 is used for recording the physical block mapped to the logical block recorded in the logical block field 502. The special mode mark field 504 is used for marking whether the logical block corresponding to such record is in the general mode or the special mode, wherein when the special mode mark field 504 is recorded with "0", it represents that the logical block corresponding to such record is in the general mode, and when the special mode mark field 504 is recorded with "1", it represents that the logical block corresponding to such record is in the special mode. For example, as shown in FIG. 5A, a first mapping record records that the logical block 0 is in the general mode and maps to a physical block 125.

Figure 5B:
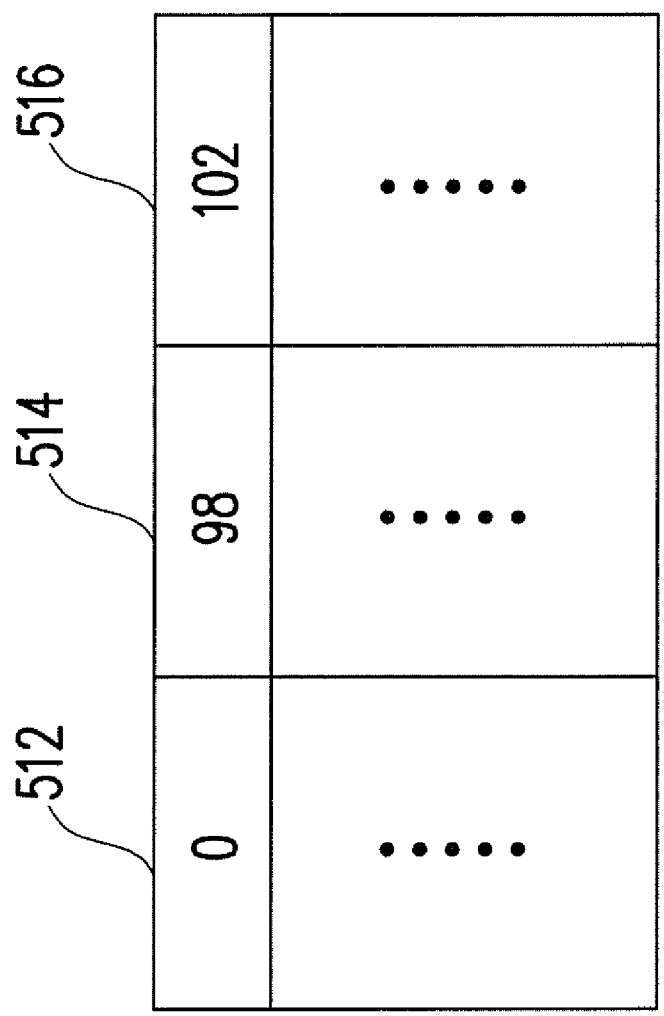
FIG. 5B is a diagram illustrating a special mode mapping table according to an exemplary embodiment of the present invention.

Moreover, in the present exemplary embodiment, the memory management module 110b further includes a special mode mapping table for recording the physical blocks mapped to the logical blocks in the special mode. FIG. 5B is a diagram illustrating a special mode mapping table according to an exemplary embodiment of the present invention. Referring to FIG. 5B, the special mode mapping table includes an index field 512, a first special mode block field 514 and a second special mode block field 516. The index field 512 is used for recording an index value of each record in the special mode mapping table, and the first special mode block field 514 and the second special mode block field 516 are used for recording the two physical blocks utilized in such record. Particularly, the index values of the index field can be recorded in the physical block field of the logical-physical mapping table. Namely, when the logical block is marked to be in the special mode, the controller 110 can find the corresponding two physical blocks from the special mode mapping table according to the value of the physical block field in the logical-physical mapping table. For example, referring to FIG. 5A and FIG. 5B, a second mapping record of FIG. 5A records that the logical block 1 is in the special mode, and the physical block field 506 records an index value 0 of the special mode mapping table. Accordingly, by inquiring the special mode mapping table, it is obtained that the record corresponding to the index value 0 includes a physical block 98 and a physical block 102. Therefore, by inquiring the logical-physical mapping table and the special mode mapping table, it is known that the lower pages of the physical block 98 and the physical block 102 are utilized to store data of the logical block 1.

It should be noted that since physical blocks of the spare area 206 are limited, and each time when a new record is added to the special mode mapping table, load of the flash memory storage system 100 is increased (for example, a relatively large buffer memory 110d is required), so that number of the logical blocks using the special mode is limited in the present exemplary embodiment. For example, the number of the logical blocks using the special mode is predetermined to 10. Accordingly, the controller 110 can select the logical blocks that are frequently accessed by the host 200 to execute the special mode.

In the present exemplary embodiment, when the flash memory storage system 100 is booted, the micro-processing unit 110a of the controller 110 can execute the machine commands of the memory management module 110b to establish a utilization times count table in the buffer memory 110d, the utilization times count table can record utilization times of each logical block. For example, when the host 200 write data into a certain logical block, the utilization times of such logical block is then increased by 1. In the present exemplary embodiment, besides the utilization times of each logical block is recorded, several logical blocks can be recorded in the buffer memory 110d to serve as the frequently access blocks according the utilization times thereof. For example, in the present exemplary embodiment, starting from the logical block having the greatest utilization times, 10 logical blocks are recorded in the buffer memory 110d according all of the utilization times arranged from the greatest to the smallest, and each time when the utilization times count table is renewed, the frequently accessed blocks recorded in the buffer memory 110d are renewed. Moreover, in the present exemplary embodiment, the utilization times count table is re-established each time when the flash memory storage system 100 is booted. In other words, all of the utilization times are reset to 0 each time when the flash memory storage system 100 is booted. However, the present invention is not limited thereto, the utilization times count table can also be stored in the system area 202 before the flash memory storage system 100 is booted, so as to continually count after a next booting.

Accordingly, in the present exemplary embodiment, when the host 200 write data into the logical block, the controller 110 then judges whether to execute the special mode on the logical block to be written according to the frequently accessed blocks recorded in the buffer memory 110d.

In another exemplary embodiment of the present invention, when the mother-child block transient relation of the logical block in the special mode is closed, the lower pages of two physical blocks can still be maintained to store data of the logical block. For example, as shown in FIG. 4C, when the mother-child block transient relation is closed, after movement of the old valid data is completed, the physical block M is erased and is associated to the spare area 206, and the physical block C1 and the physical block C2 are associated to the data area 204. Namely, the logical block L maps to the lower pages of the physical block C1 and the physical block C2. Meanwhile, when the host 200 again executes a write command to the logical block which is already in the special mode, the controller 110 judges whether the logical block in the special mode is still the frequently accessed block according to the record in the buffer memory 110d.

If the logical block in the special mode is still the frequently accessed block, the controller 110 then selects two physical blocks from the spare area 206 to serve as the substitute physical blocks, and only writes data into the lower pages of these two physical blocks. Moreover, if the logical block in the special mode is no more the frequently accessed block, the controller then selects one physical block from the spare area 206 to serve as the substitute physical block, and writes data into the upper pages and the lower pages of this physical block. In other words, when the logical block that is already in the special mode is no longer the frequently accessed block, such logical block is resumed back to the general mode, and no longer occupies two physical blocks.

FIG. 6 is a flowchart illustrating a block management method according to an exemplary embodiment of the present invention.

Referring to FIG. 6, when the flash memory storage system 100 is booted, in step S601, a plurality of logical blocks is configured for being accessed by the host 200. Next, in step S603, the utilization times of each of logical blocks is recorded, wherein when the host 200 writes data into the logical block, the utilization times of the logical block is renewed.

Next, in step S605, all of the logical blocks are arranged according to utilization times thereof, and starting from the logical block having the greatest utilization times, a predetermined number (for example, 10) of logical blocks are sequentially recorded as the frequently accessed blocks. In the present exemplary embodiment, the predetermined number of logical blocks is set as the frequently accessed blocks. However, in another exemplary embodiment, the logical blocks having the utilization times thereof being greater than a specific frequent accessing threshold value can be set as the frequently accessed blocks, wherein such frequent accessing threshold value is determined by the user and can be dynamically varied. For example, the frequent accessing threshold value can be set to 255.

In step S607, the controller 110 waits and receives the writing command from the host 200, and in step S609, the controller 110 judges whether the logical block to be written belongs to the frequently accessed block.

If the logical block to be written belongs to the frequently accessed block according to a judgement of the step S609, in step S611, two physical blocks are selected from the spare area 206, and only the lower pages of the selected physical blocks are used for writing with data.

If the logical block to be written does not belongs to the frequently accessed block according to the judgement of the step S609, in step S613, one physical block is selected from the spare area 206, and the upper pages and the lower pages of the selected physical block are used for writing with data.

As described above, when the controller 110 manages the physical blocks of the flash memory 130 in the special mode, the controller 110 then has to record related mapping relations for follow-up accessing. Therefore, after the steps S611 and S613, the logical-physical mapping table and/or the special mode mapping table are/is renewed. For example, the block management method further includes recording a special mode mark in the logical-physical mapping table to represent that data written based on the step S611 is stored in the lower pages of the selected physical blocks, and recording the two physical blocks in the special mode mapping table.

Next, the steps S603 and S605 are repeated to renew the utilization times and the frequently accessed blocks, and in the step S607, the controller 110 again waits and receives the writing command. Though not illustrated in FIG. 6, those skilled in the art should easily understand that the block management steps shown in FIG. 6 are ended when a turning-off or a power-off command is received.

In summary, in the present invention, a special mode of storing data of one logical block by the lower pages of two physical blocks is provided for managing the physical blocks. Accordingly, when the logical block using such special mode is accessed, data accessing speed thereof is effectively improved. Particularly, in the present invention, the logical blocks frequently accessed by the host can be judged according to the utilization times thereof, and by executing the special mode to the logical blocks belonging the frequently accessed block, the system efficiency can be effectively improved under a limited system resource.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A block management method, for managing a multi level cell (MLC) NAND flash memory, wherein the MLC NAND flash memory has a plurality of physical blocks grouped into at least a data area and a spare area, each of the physical blocks has a plurality of pages divided into a plurality of upper pages and a plurality of lower pages with a writing speed thereof being greater than that of the upper pages, the block management method comprising:
   configuring a plurality of logical blocks for being accessed by a host;
   recording a logical block belonging to a frequently accessed block; and
   performing a special mode to respectively use the lower pages of at least two physical blocks of the MLC NAND flash memory for storing data of the logical block belonging to the frequently accessed block,
   wherein when a mother-child block transient relation corresponding to the logical block is closed, the logical block maps to the lower pages of the at least two physical blocks of the MLC NAND flash memory.

2. The block management method as claimed in claim 1, wherein the step of recording the logical block belonging to the frequently accessed block includes:
   recording utilization times of each of the logical blocks; and
   arranging all of the logical blocks according to the utilization times, and sequentially recording a predetermined number of the logical blocks as the frequently accessed block, from the logical block having a greatest utilization times.

3. The block management method as claimed in claim 1, wherein the step of executing the special mode to respectively use the lower pages of the two physical blocks of the MLC NAND flash memory for storing data of the logical block belonging to the frequently accessed block includes:
   judging whether the logical block to be written is the frequently accessed block when the host writes data to each of the logical blocks; and
   selecting at least two physical blocks from the spare area, and only writing data to the lower pages of the selected physical blocks if the logical block to be written is the frequently accessed block.

4. The block management method as claimed in claim 2, wherein the step of recording utilization times of each logical block includes updating the utilization times of the logical blocks when the host writes data into the logical blocks.

5. The block management method as claimed in claim 3, further comprising:
   recording a special mode mark in a logical-physical mapping table to represent that data of the logical block to be written is stored in the lower pages of the selected physical blocks, and recording the two physical blocks storing the data of the logical block to be written in a special mode mapping table, if the logical block to be written is the frequently accessed block.

6. The block management method as claimed in claim 3, further comprising:
   selecting another physical block from the spare area and temporarily storing data to be written to the logical block in the selected physical block, when data of the logical block to be written is stored in the lower pages of the two physical block of the MLC NAND flash memory, and meanwhile the host executes a random write mode to the logical block to be written.

7. The block management method as claimed in claim 3, further comprising:
   selecting a physical block from the spare area and writing data into the upper pages and the lower pages of the selected physical block when the logical block to be written is not the frequently accessed block.

8. The block management method as claimed in claim 1, wherein the step of recording the logical block belonging to the frequently accessed block includes:
   recording utilization times of each logical block; and
   judging whether the utilization times of each logical block is greater than a frequent accessing threshold value, wherein each of the logical blocks with the utilization times thereof being greater than the frequent accessing threshold value is recorded as the frequently accessed block.

9. A controller, for a flash memory storage system having an MLC NAND flash memory, wherein the MLC NAND flash memory of the flash memory storage system has a plurality of physical blocks grouped into at least a data area and a spare area, each of the physical blocks has a plurality of pages divided into a plurality of upper pages and a plurality of lower pages with a writing speed thereof being greater than that of the upper pages, the controller comprising:
   a micro-processing unit;
   a flash memory interface, coupled to the micro-processing unit;
   a buffer memory; coupled to the micro-processing unit; and
   a memory management module, coupled to the micro-processing unit, and having a plurality of machine commands that can be executed by the micro-processing unit for implementing a plurality of block management steps, wherein the block management steps include:
   configuring a plurality of logical blocks for being accessed by a host;
   recording a logical block belonging to a frequently accessed block; and
   performing a special mode to respectively use the lower pages of at least two physical blocks of the MLC NAND flash memory for storing data of the logical block belonging to the frequently accessed block,
   wherein when a mother-child block transient relation corresponding to the logical block is closed, the logical block maps to the lower pages of the at least two physical blocks of the MLC NAND flash memory.

10. The controller as claimed in claim 9, wherein the step of recording the logical block belonging to the frequently accessed block includes:
    recording utilization times of each of the logical blocks; and
    arranging all of the logical blocks according to the utilization times, and sequentially recording a predetermined number of the logical blocks as the frequently accessed block, starting from the logical block having a greatest utilization times.

11. The controller as claimed in claim 9, wherein the step of executing the special mode to respectively use the lower pages of the two physical blocks of the MLC NAND flash memory for storing data of the logical block belonging to the frequently accessed block includes:
    judging whether the logical block to be written is the frequently accessed block when the host writes data to each of the logical blocks; and
    selecting at least two physical blocks from the spare area, and only writing data to the lower pages of the selected physical blocks if the logical block to be written is the frequently accessed block.

12. The controller as claimed in claim 10, wherein the step of recording utilization times of each logical block includes updating the utilization times of the logical blocks when the host writes data into the logical blocks.

13. The controller as claimed in claim 11, wherein the block management steps further comprise:
    recording a special mode mark in a logical-physical mapping table to represent that data of the logical block to be written is stored in the lower pages of the selected physical blocks, and recording the two physical blocks storing the data of the logical block to be written in a special mode mapping table, if the logical block to be written is the frequently accessed block.

14. The controller as claimed in claim 11, wherein the block management steps further comprise:
    selecting another physical block from the spare area and temporarily storing data to be written to the logical block in the selected physical block, when data of the logical block to be written is stored in the lower pages of the two physical block of the MLC NAND flash memory, and meanwhile the host executes a random write mode to the logical block to be written.

15. The controller as claimed in claim 11, wherein the block management steps further comprise:
    selecting a physical block from the spare area and writing data into the upper pages and the lower pages of the selected physical block when the logical block to be written is not the frequently accessed block.

16. The controller as claimed in claim 9, wherein the flash memory storage system is a flash drive, a memory card or a solid state drive.

17. The controller as claimed in claim 9, wherein the step of recording the logical block belonging to the frequently accessed block includes:
    recording utilization times of each logical block; and
    judging whether the utilization times of each logical block is greater than a frequent accessing threshold value, wherein each of the logical blocks with the utilization times thereof being greater than the frequent accessing threshold value is recorded as the frequently accessed block.

18. A storage system, comprising:
    an MLC NAND flash memory, having a plurality of physical blocks grouped into at least a data area and a spare area, and each of the physical blocks having a plurality of pages divided into a plurality of upper pages and a plurality of lower pages with a writing speed thereof being greater than that of the upper pages;
    a connector; and
    a controller, electrically connected to the MLC NAND flash memory and the connector, the controller executing a plurality of machine commands of a memory management module for implementing a plurality of block management steps, wherein the block management steps include:
    configuring a plurality of logical blocks for being accessed by a host;
    recording a logical block belonging to a frequently accessed block; and
    performing a special mode to respectively use the lower pages of at least two physical blocks of the MLC NAND flash memory for storing data of the logical block belonging to the frequently accessed block, wherein when a mother-child block transient relation corresponding to the logical block is closed, the logical block maps to the lower pages of the at least two physical blocks of the MLC NAND flash memory.

19. The storage system as claimed in claim 18, wherein the step of recording the logical block belonging to the frequently accessed block includes:
   recording utilization times of each of the logical blocks; and
   arranging all of the logical blocks according to the utilization times, and sequentially recording a predetermined number of the logical blocks as the frequently accessed block, starting from the logical block having a greatest utilization times.

20. The storage system as claimed in claim 18, wherein the step of executing the special mode to respectively use the lower pages of the two physical blocks of the MLC NAND flash memory for storing data of the logical block belonging to the frequently accessed block includes:
   judging whether the logical block to be written is the frequently accessed block when the host writes data to each of the logical blocks; and
   selecting at least two physical blocks from the spare area, and only writing data to the lower pages of the selected physical blocks if the logical block to be written is the frequently accessed block.

21. The storage system as claimed in claim 19, wherein the step of recording utilization times of each logical block includes updating the utilization times of the logical blocks when the host writes data into the logical blocks.

22. The storage system as claimed in claim 20, wherein the block management steps further comprise:
   recording a special mode mark in a logical-physical mapping table to represent that data of the logical block to be written is stored in the lower pages of the selected physical blocks, and recording the two physical blocks storing the data of the logical block to be written in a special mode mapping table, if the logical block to be written is the frequently accessed block.

23. The storage system as claimed in claim 20, wherein the block management steps further comprise:
   selecting another physical block from the spare area and temporarily storing data to be written to the logical block in the selected physical block, when data of the logical block to be written is stored in the lower pages of the two physical block of the MLC NAND flash memory, and meanwhile the host executes a random write mode to the logical block to be written.

24. The storage system as claimed in claim 20, wherein the block management steps further comprise:
   selecting a physical block from the spare area and writing data into the upper pages and the lower pages of the selected physical block when the logical block to be written is not the frequently accessed block.

25. The storage system as claimed in claim 18, wherein the step of recording the logical block belonged to the frequently accessed block includes:
   recording utilization times of each logical block; and
   judging whether the utilization times of each logical block is greater than a frequent accessing threshold value, wherein each of the logical blocks with the utilization times thereof being greater than the frequent accessing threshold value is recorded as the frequently accessed block.

* * * * *